United States Patent
Bryant et al.

(10) Patent No.: US 7,263,647 B2
(45) Date of Patent: Aug. 28, 2007

(54) SIGNAL ERROR DETECTION IN RAILROAD COMMUNICATION SYSTEM

(75) Inventors: Robert Francis Bryant, Palm Bay, FL (US); David Carroll Teeter, Satellite Beach, FL (US); Robert James Foy, Melbourne, FL (US); Joseph Bibb Cain, Indialantic, FL (US); Adrian Jones, Indialantic, FL (US); Don Keith Johnson, Palm Bay, FL (US); Frank Sanzone, Satellite Beach, FL (US); Dale Henry Delaruelle, Melbourne, FL (US)

(73) Assignee: General Electric Company, Schenectady, NY (US)

( * ) Notice: Subject to any disclaimer, the term of this patent is extended or adjusted under 35 U.S.C. 154(b) by 562 days.

(21) Appl. No.: 10/273,431

(22) Filed: Oct. 17, 2002

(65) Prior Publication Data

US 2003/0084395 A1 May 1, 2003

Related U.S. Application Data

(60) Provisional application No. 60/329,984, filed on Oct. 17, 2001.

(51) Int. Cl.
*H03M 13/00* (2006.01)
(52) U.S. Cl. ............... 714/758; 714/755; 714/756
(58) Field of Classification Search ........... 714/758, 714/755, 756
See application file for complete search history.

(56) References Cited

U.S. PATENT DOCUMENTS

| | | | | |
|---|---|---|---|---|
| 4,553,723 A | | 11/1985 | Nichols et al. | |
| 4,582,280 A | | 4/1986 | Nichols et al. | |
| 4,630,272 A | * | 12/1986 | Fukami et al. | 714/755 |
| 4,953,168 A | * | 8/1990 | Odaka | 714/755 |
| 5,039,038 A | | 8/1991 | Nichols et al. | |
| 5,172,380 A | * | 12/1992 | Odaka | 714/755 |
| 5,392,299 A | * | 2/1995 | Rhines et al. | 714/756 |
| 5,432,800 A | * | 7/1995 | Kuroda et al. | 714/758 |
| 5,471,503 A | * | 11/1995 | Altmaier et al. | 375/133 |
| 5,577,053 A | * | 11/1996 | Dent | 714/755 |
| 5,720,455 A | * | 2/1998 | Kull et al. | 246/187 C |

OTHER PUBLICATIONS

Stephen B. Wicker, Error control Systems for Digital Communications and Storage, Prentice Hall, 1995, pp. 122-123.*

* cited by examiner

*Primary Examiner*—Joseph D. Torres
(74) *Attorney, Agent, or Firm*—John L. DeAngelis; Beusse Wolter Sanks Mora & Maire, P.A.; Carlos L. Hanze, Esquire

(57) ABSTRACT

A communication system for a distributed locomotive power/brake control system for a railroad train having a lead locomotive and one or more remote locomotives. Command and status signals are communicated over the system between the lead and remote locomotives. Each communicated message includes an information segment comprising the command or status information, and an error control segment for detecting errors in the information segment. The error control segment further comprises cyclic redundancy code words and parity bits formed according to the horizontal or vertical parity of the information segment and the cyclic redundancy code words.

1 Claim, 4 Drawing Sheets

SIGNAL ERROR DETECTION IN RAILROAD COMMUNICATION SYSTEM

This invention claims priority to the provisional patent application filed on Oct. 17, 2001 and assigned application No. 60/329,984.

FIELD OF THE INVENTION

This invention relates generally to railroad communication systems, and more particularly to error detection subsystems operative in conjunction with railroad communication systems.

BACKGROUND OF THE INVENTION

Radio communication systems (of voice or data signals) for trains having a lead unit and one or more remote control units or groups of remote control units are known. This arrangement where the locomotives are distributed within the train consist is referred to as distributed power operation and thus the communication system is referred to as a distributed power communication system. Generally, the one or more remote units or groups of remote units are controlled by commands from the lead unit carried over the communication system. The radio communication channel also carries responses by the remote units to the lead unit commands. In addition, certain important alarm conditions in the remote units and operational parametric data are brought to the attention of the engineer in the lead unit to ensure accurate and safe train operation.

Since many of the messages communicated between the lead and remote units in the moving train relate to proper traction and braking commands, they must be reliably and accurately received, even under a variety of changing operational and environmental conditions that affect the reliability of the communication link. Also, accuracy and reliability are required for signals communicated between the train and various land-based sites, such as a dispatching center, a locomotive monitoring and diagnostic center, personnel in a rail yard or in a loading/unloading facility and wayside equipment.

FIG. 1 schematically illustrates a train 18 and a distributed power communication system 10 for carrying control and monitoring signals between one or more remote units 12 and 13 and a lead unit 14 (FIG. 1). In another embodiment, not shown, the function performed by the lead unit 14 is replaced by a control tower where commands are issued (directly of via the lead unit) by a dispatcher to all locomotives in the train consist. An off-board repeater 26 may be disposed within radio communication distance of the train 18 for relaying communication signals transmitted between the lead unit 14 and the remote units 12 and 13 when direct communication between the lead unit 14 and the remote units is hampered, such as while the train 18 is traveling through a tunnel. The lead unit 14, the remote units 12 and 13, the off-board repeater 26 and the control tower (not shown) are provided with a transceiver 28 (and an antenna 29) for receiving and transmitting the communication signals. The lead unit transceiver 28 is associated with a lead controller 30 for issuing commands to control the remote units 12 and 13 and for responding to incoming signals from the remote units 12 and 13. Each of the remote units 12 and 13 and the off-board repeater 26 includes a remote controller 32 responsive to a signal from the transceiver 28 of the lead unit 14 for responding to the lead unit commands. The controller 32 can also initiate the transmission of messages to the lead unit 14 to advise of status information and alarm conditions.

In one embodiment of the existing railroad communication system, the communication link is a single half-duplex communication channel with a three KHz bandwidth. Each message transmission comprises a serial bit stream code word, further comprising information bits and error detecting bits derived from a geometrical error detecting scheme, modulating a carrier signal according to known frequency-shift keying modulation techniques. The types, contents and format of the various messages carried over the communication system 10 are described in detail in the commonly owned U.S. Pat. Nos. 5,039,038 and 4,582,580, both entitled Railroad Communication System, which are incorporated by reference herein. The system elements and message formats were intended to provide a secure transmission link for the information signals, with a low probability of accepting a message corrupted during transmission. The system also was intended to offer a low probability of interference from other lead and remote units on the same radio channel and within radio transmission distance.

The train 18 further includes a plurality of cars 20 that separate the lead unit 14 from the remote units 12 and 13. The cars 20 are coupled by a brake pipe 22 that signals a brake application in response to a drop in brake pipe pressure and a brake release in response to a pressure increase. The pressure in the brake pipe is controlled by an air brake controller 24 in the lead unit 14 and any or all of the remote units 12 and 13.

Each message includes information bytes or words and error detecting bits. As is known in the art, the inclusion of error detecting bits allows the receiver to detect bit errors that can occur during transmission over a noisy channel, at the expense of increasing the message overhead. In a prior art embodiment of the communication system 10, the error detecting bits are constructed in a geometrical format as horizontal and vertical parity bits. Each information byte is checked for odd or even parity, and as required an extra bit is added to satisfy the odd or even parity condition. This extra bit is referred to as a horizontal parity bit. Each message also includes a vertical parity byte that is generated to create a selectable odd or even parity for each column in the message, where the columns are formed by juxtaposing the words or bytes in overlying rows and determining the bit parity in each column. Once the parity of each column is determined, the vertical parity byte is formed to provide odd or even parity for the column.

An example is shown in FIG. 2 where the individual bits for information words A through D are set forth. These bits are merely illustrative and are not intended to represent a complete message carried over the communication system 10. Each word has eight information bits, labeled 0 through 7. The column labeled "HP" is the horizontal parity bit. In the example, odd parity is selected and therefore the value in the HP column is selected to ensure that an odd number of ones appear in each row, or that each of the bytes has odd parity. The vertical parity is established by the word in the "VP" row and in this example is selected to ensure that an even number of ones appear in each column.

The horizontal and vertical parity bits are employed at the receiving unit of the communication system 10 to determine whether errors occurred in the message as it traversed the channel. Upon receipt of a message by the lead unit 14 or a remote unit 12 or 13, the associated transceiver 28 demodu lates the received signal into a baseband binary serial data stream and segregates the data stream into individual bytes. The applicable controller 30 or 32 determines the horizontal parity of the demodulated bytes as they are segregated. To determine the vertical parity, the bytes are arranged into a block form such as illustrated in FIG. 2. (Note that the formation of the code block of FIG. 2 is merely illustrative. It is not necessary to construct the block as the vertical parity can be determined by buffering individual bits such that buffered bits can be analyzed as though they were oriented in a column.) If the received words have the correct vertical and horizontal parity, the command or message represented by the baseband information segment is executed. If the parity is incorrect, the receiving unit rejects the message and a response is not transmitted. If the initiating lead unit (or the tower) does not receive a valid response from each unit to which the message was targeted, the message is retransmitted. At the receiving unit the retransmitted message is again demodulated and processed through the error detecting steps.

During most communication intervals the train is in motion. Thus the communication link can be lost or degraded when man-made or natural structures interfere with the communication path between the transmitting and receiving units as the train traverses the track. Also, the communication signal can be disrupted when the line-of-sight is lost between the transmitting and receiving units. Such link disruptions can cause errors in the received message. It has been observed during operation of the prior art distributed power communication system as described above, that certain four-bit errors in the received message may not be detected. There is also a statistically significant probability of not detecting errors with more than four erred bits. If errors go undetected at the receiving unit, train operational problems may arise. For example, if the lead unit 14 transmits a brake application command to the remote units, and the command is corrupted during transmission, but the corruption created errors in an undetectable error pattern, then the command is interpreted as a valid command, but a brake application is not made at the remote units 12 and 13.

An example of undetected errors that can occur with the prior art geometrical parity scheme is illustrated in FIG. 3. One class of undetectable errors cause an even number of errors in an even number of rows, where the errors occur in the same columns within each row. For simplicity, FIG. 3 illustrates only five rows of information words, each word comprising eight bits, plus a horizontal parity bit (HP) and a vertical parity bit (VP). Odd parity was selected. The erred bits are stricken and the value of the erred bit written above the strike mark. An error occurs when a transmitted zero bit is received as a one bit (or vice versa) due to noise and other channel effects. As can be seen by checking the parity of each row and column after occurrence of the indicated errors, the horizontal and vertical parity bits still indicate five correct information words, notwithstanding four erred bits. Such undetected errors can cause serious operational problems as the remote units 12 and 13 will not receive the correct command or data as transmitted from the lead unit 14, but are unable to determine that an error occurred.

Implementation of additional error detection capability to reduce the bit error probability is constrained by the large number of operational locomotives (lead units 14 and remote units 12 and 13) currently utilizing the prior art geometric parity scheme described above and the requirement that all locomotives in a fleet must be interoperable. The process of assembling a train having multiple locomotives so as to have sufficient motive power to meet the train's mission requirements is a complex one that would be made more difficult by the additional issue of locomotive communication system interoperability. Thus it is not possible to reduce the bit error rate by simply upgrading the communication system 10 of just isolated, individual locomotives to include one of the known more powerful error detecting methods, as the locomotives operating with the legacy geometric parity scheme would then not interoperate with the locomotives employing the newer error detecting scheme. Upgrading all locomotives throughout the entire North American railway network over a short period of time is problematic. Such a conversion would be a time-consuming, burdensome and expensive task in light of the large number of locomotives involved, their geographic dispersion and the various railroad company owners.

The problem thus remains to provide an error detecting scheme that reduces the bit error rate below that provided with the existing geometric parity scheme, while providing interoperability with communication systems employing the existing geometric parity scheme.

BRIEF SUMMARY OF THE INVENTION

To improve the error detecting capabilities of the distributed power communication system, the present invention teaches the use of additional error detection bits that form part of the information to be transmitted and operable in combination with the existing geometric parity bits schemes. This enables the transmitted word to be decoded by a receiver having additional error detection capability with greater accuracy and reliability. At the same time, the additional error detection bits are ignored by a receiving unit that is not equipped to process the additional error detection bits. In a preferred embodiment, a cyclic redundancy code polynomial is used to provide the additional error detection bits.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 3 is a data block illustrating undetected errors according to the prior art scheme;

FIG. 4 is a data block illustrating the error detecting bits according to the teachings of the present invention;

DETAILED DESCRIPTION OF THE INVENTION

Figures 1, 2:
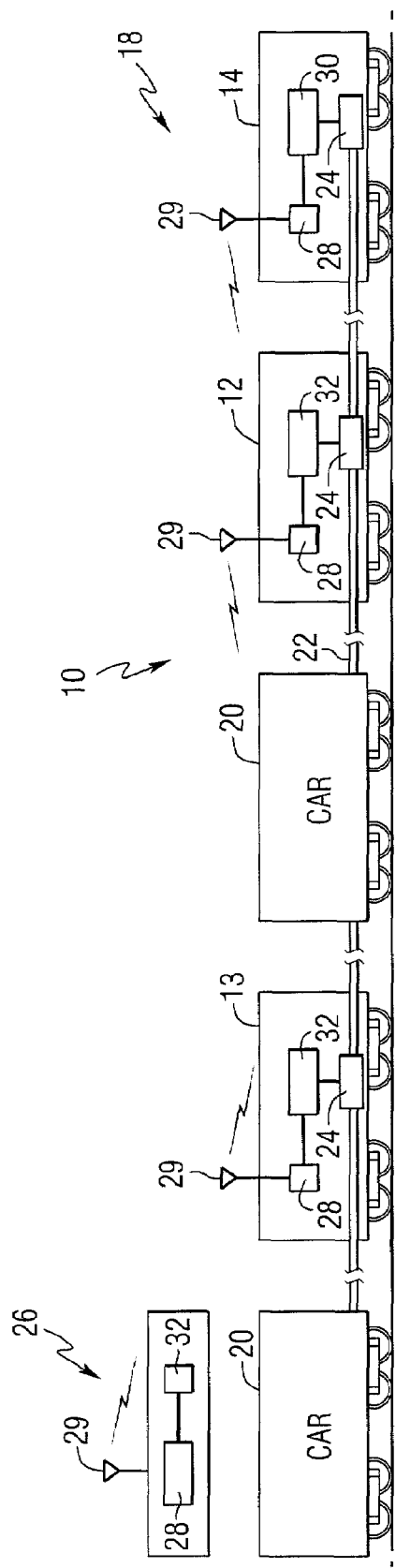
FIG. 1 is block diagram of a railroad train to which the teachings of the present invention can be applied.
FIG. 2 is a table illustrating data bits in block format.

Before describing in detail the particular railroad communication system in accordance with the present invention, it should be observed that the present invention resides primarily in a novel combination of hardware elements and method steps related to data error detection. Accordingly, the hardware elements and method steps have been represented by conventional elements in the drawings, showing only those specific details that are pertinent to the present invention, so as not to obscure the disclosure with structural details that will be readily apparent to those skilled in the art having the benefit of the description herein.

To improve the error detection capabilities of the communication system 10 associated with distributed operation of a railroad train, the geometric code described above is augmented with a cyclic redundancy check (CRC) code or a shortened cyclic code.

The substantial improvement in the undetected error performance is due primarily to the different and independent schemes for developing the CRC and the geometrical error detecting bits. The two schemes are optimized to detect different patterns of data errors. The geometrical bits are constructed based on the parity of the message when arranged in a block, and thus certain errors go undetected as illustrated in FIG. 3 above. The CRC bits are formed from the remainder produced by dividing the shifted information bits by a code generator polynomial, such as one of the code generator polynomials set forth below. Thus the CRC bits detect the undetected errors illustrated in FIG. 3. In one embodiment, the combination of the geometric error detecting bits and the CRC bits improves the error detecting capabilities by about six orders of magnitude over use of the geometric parity bits alone.

Further, the additional error detecting bits generated by the CRC code are included within the information segment of the message, with the vertical and the horizontal parity bits "wrapped around" both the information bits and the CRC bits. FIG. 4 illustrates an exemplary message 40, including information bits 41 and CRC bits 42. Horizontal parity bits 43 are formed based on the parity of the rows of information bits 41 and CRC bits 42. Odd parity is selected for this example. Vertical parity bits 44 (odd parity) are formed based on the columns of the information bits 41, the CRC bits 42 and the horizontal parity bits 43.

Thus CRC-equipped locomotives utilize both the geometrical parity bits and the CRC bits to detect message errors. Non-CRC-equipped locomotives can use only the geometrical parity bits, ignoring the CRC bits as simply extraneous "information" bits that it does not need to process. Although the non-CRC equipped locomotives cannot take advantage of the additional error detecting capability within the message, they can detect errors based on geometric parity and thus can interoperate with the CRC-equipped locomotives (and other non-CRC-equipped locomotives).

It is known that cyclic codes are based on a generator polynomial and that the degree of the polynomial equals the number of check bits included in the bit stream to provide the error detecting function. One exemplary generator polynomial appropriate for use with the distributed power communication system 10 is:

$$g(X)=1+X^2+X^{15}+X^{16}.$$

Thus this generator polynomial produces 16 check bits to detect errors in the information bit stream. When a cyclic code generated according to the above generator polynomial is annexed to the geometrical code described above, there is a significant improvement in the undetected error rate performance. In another embodiment a code generator polynomial of the form $$g(X)=1+X^5+X^{12}+X^{16}$$

serves as the generator polynomial.

According to one embodiment of the distributed power communication systems 10, the message transmitted over the link comprises a 20-32 byte information field plus a one-byte vertical parity word. The total code word is thus 21 to 33 bytes long. Assuming, for example, that a 21 byte code word is augmented with two cyclic redundancy check (CRC) code bytes of the present invention, then a transmitted code word comprises 18 information bytes (144 bits), one horizontal parity bit for each information byte (18 bits), 2 bytes (16 bits) of cyclic redundancy check bits, and 9 bits of vertical parity. The two CRC bytes check all of the information bytes and the horizontal parity bit associated with each information byte. The vertical parity byte checks the CRC bytes and the horizontal parity bytes. The total message size is 189 bits with 45 parity bits. There are 29 geometric parity bits (nine vertical and 18 horizontal) plus 16 CRC check bits.

In a situation where the communication system 10 includes one CRC-capable and one non-CRC-capable locomotive, the CRC-capable locomotive uses 49 error detecting bits, i.e., the CRC bits, the horizontal parity bits and the vertical parity bits to perform error detection. The non-CRC-equipped locomotive uses only the vertical and the horizontal parity bits (29 bits) and ignores the CRC bits.

In various embodiments, the order in which the two CRC check bytes, the horizontal parity bits and the vertical parity bits are formed can be interchanged. Thus according to one embodiment, the CRC check bytes are formed first, followed by the horizontal and then the vertical parity bits. In another embodiment, the CRC check bytes are formed first, followed by the vertical then the horizontal parity bits. In both such embodiments, the CRC check words are treated as part of the information, with respect to the later formation of the vertical and horizontal parity bits (in either order). Thus this technique is distinguished from the conventional error detecting scheme where the error control code words or bits are appended to the information bits, and treated as a separate entity for separate processing at the receiving site.

The implementation of the CRC error-checking capabilities into all the distributed power communication systems operating on today's locomotives will take some time to complete. Since for a time there will be both non-CRC and CRC distributed power communication systems in operation, it is advisable, as discussed above, to develop an error detecting system that is interoperable with both CRC and non-CRC systems. As these legacy systems are upgraded or replaced, CRC error detecting capabilities can be incorporated. To allow this interoperability, the message format includes a bit for indicating whether a locomotive is CRC capable.

When a communication session is initiated, the lead unit 14 indicates CRC-capability by setting a CRC-designating bit within the message and including the CRC code words in the message. If CRC processing is available at the receiving unit, that is, either one or both of the remote units 12 and 13, the CRC code words are used to detect errors in the received message. Also, the designating bit is set in the reply message and the reply message includes CRC code words generated as described above, i.e., the reply is CRC-capable.

If the receiving unit is not CRC-capable, the CRC designating bit in the message from the lead unit 12 has no effect and is ignored, the CRC code bytes are ignored as the receiving unit decodes the received message and the receiving unit replies with a non-CRC reply, that is, where the CRC designating bit in the reply message is not set and no CRC code bytes appear in the reply message. The lack of a set bit in the reply message indicates to the lead unit 14 that the receiving unit is not CRC-capable and thus future messages to that receiving unit are not CRC-encoded. Advantageously, the error detecting scheme of the present invention where the CRC bits are treated as part of the data or information with respect to the later formation of the vertical and horizontal bits, allows the receiving unit to simply ignore the CRC code words, while continuing to use the horizontal and vertical parity bits for error detection.

This arrangement permits non-CRC-capable locomotives to receive messages from CRC-capable locomotives and maintain the ability to perform error detecting on the received message using the horizontal and the vertical parity bits. Thus the non-CRC-capable and the CRC-capable locomotives are interoperable, with error detection provided by the horizontal and vertical parity bits. Two CRC-capable locomotives can communicate with error detection provided by both the horizontal and vertical parity bits and by the CRC bits. The addition of the CRC bits to the message is backward compatible with messages that lack the CRC code bits.

If the lead unit 14 is not CRC-capable, then the CRC designating bit is not set in the message and in response the remote units 12 and/or 13 reply with a non-CRC reply message. Even if the remote units 12 and/or 13 are CRC-capable, CRC operation is suppressed when communicating with a non-CRC lead unit 14.

Figure 5:
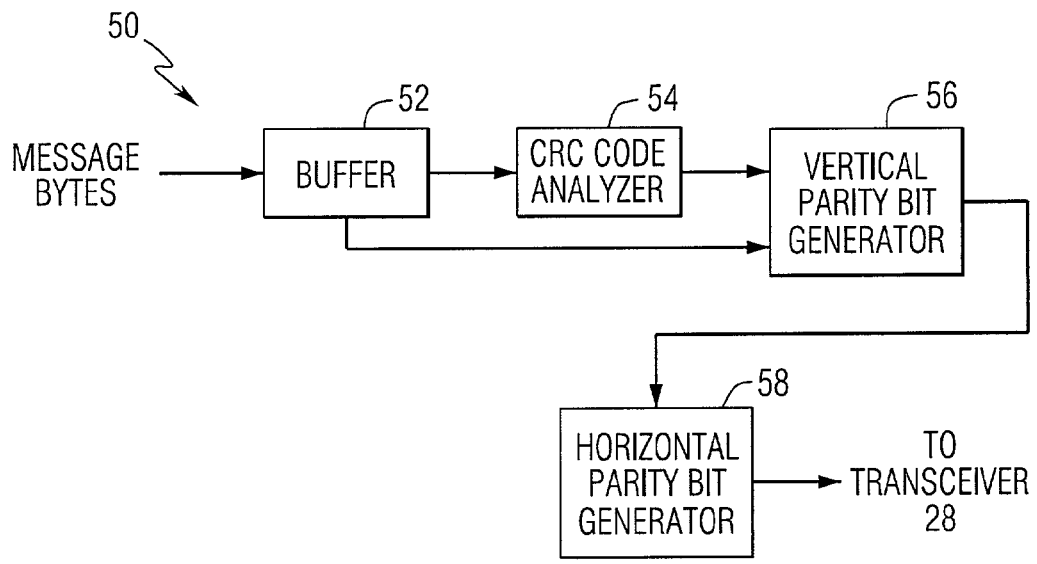
FIGS. 5 and 6 are block diagrams of an encoder and decoder according to the teachings of the present invention.

FIG. 5 illustrates, in block diagram form, an encoder 50 for generating a message bit stream. Conventionally, the encoder 50 is one element of the control unit 30 or 32 in the lead unit 14 or the remote units 12 and 13, respectively. The encoder 50 comprises a processing device performing all functions related to the formation of information bits, the CRC bits and the geometric parity bits, or a plurality of processing devices, each performing one of the listed functions. Further, the processing device can comprise a general purpose processing device programmed to perform the illustrated functions, as well as performing other functions within the control units 30 or 32. Alternatively, a special purpose processing device can be employed to provide the described functionality.

With respect to FIG. 5, the processing devices are referred to by their functional attributes. The information bytes are assembled in a buffer 52 as they are received from other components (not shown) of the lead unit 14 or the remote units 12 and 13, and input to a CRC code analyzer 54 for generating the CRC code bits. A vertical parity bit generator 56 receives the information bits and the CRC bits, for generating the vertical parity bits (odd or even) as described above. The resulting bits are input to a horizontal parity bit generator 58 for constructing the horizontal parity bits (odd or even). The output code word is input to the transceiver 28 for modulating a carrier that is transmitted to the receiving unit, that is, either or both of the remote units 12 and 13 or the lead unit 14.

Although the horizontal parity bit generator 58 is illustrated as a separate component of the encoder 50, in one embodiment this function is performed by hardware within the transceiver 28, e.g., by a universal asynchronous receiver/transmitter (UART) that converts the multiple parallel word bit streams of the message into a single serial bit stream for carrier modulation within the transceiver 28. During that conversion process the UART appends the horizontal parity bit.

In another embodiment, the appending of the horizontal and vertical code words is reversed. That is, the information bytes and the CRC bytes are formed and a horizontal parity bit (odd or even) for each of these bytes is formed. The information and CRC bytes, together with the respective horizontal parity bit for each, are then figuratively arranged into the code block, as illustrated in matrix and the vertical parity of each matrix column is determined, after which the vertical parity bit is appended, as determined by whether odd or even vertical parity is selected.

In any of the various embodiments presented herein the horizontal and vertical parities can be the same or different. That is both can be odd or even parity. Alternatively even parity can be selected for the horizontal parity with odd vertical parity, or vice versa.

Figure 6:
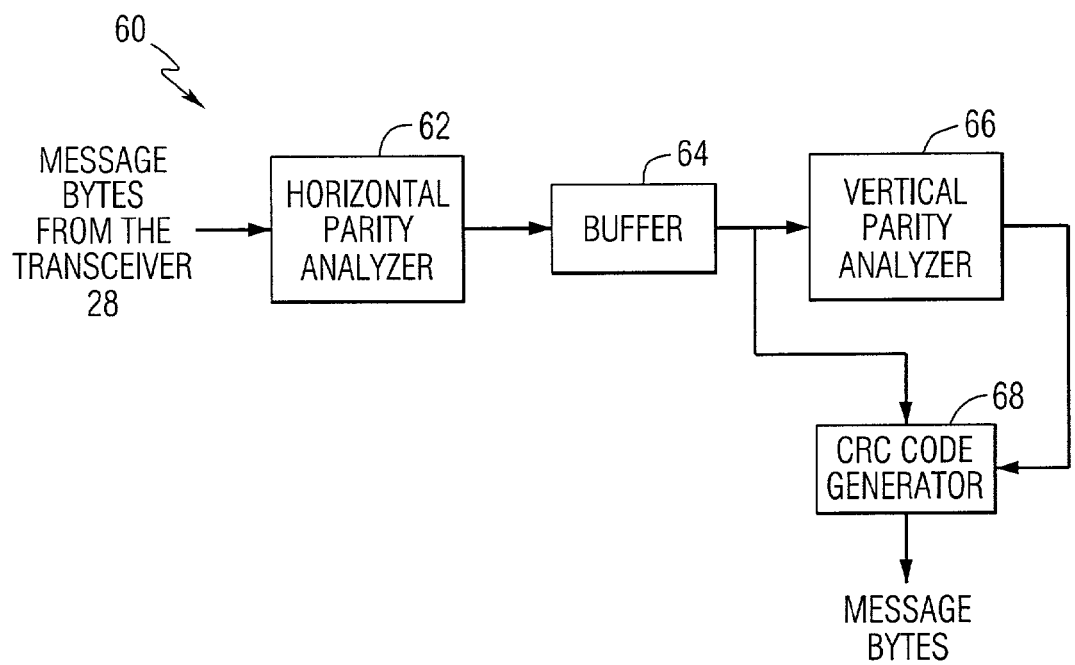

At the receiving site, error checking occurs in a decoder 60 depicted in the block diagram of FIG. 6. The message is received and demodulated in the transceiver 28. The received bytes are input to a horizontal parity analyzer 62 where the horizontal parity of each byte is determined. The correct parity (either odd or even) for the bytes is known in advance. Thus the horizontal parity analyzer 62 determines whether the horizontal parity of each received byte is correct.

Although the horizontal parity analyzer 62 is illustrated as a separate component of the decoder 60, in one embodiment the horizontal parity analysis process is performed within the UART of the transceiver 28 during the process of converting the received serial bit stream to a parallel bit stream of individual bytes.

If the horizontal parity of the bytes is correct, the message is stored in a buffer 64. The individual words are accessed by a vertical parity analyzer 66 to determine the parity of each column and compare the result with the known correct vertical parity. If the vertical parity is correct, the bytes stored within the buffer 64 are accessed by a CRC code generator 68 and the CRC bits are generated in response to the received message. If the generated CRC bits match the received CRC bits, the received message has a very high probability of being free of errors. The message is then input to the control unit 30 or 32, as appropriate, for further processing consistent with the contents of the message.

With respect to the alternative embodiment described above wherein the order of appending the horizontal and vertical parity bits is reversed (i.e., the horizontal parity bit first followed by the vertical parity bit) the order of parity checking at the receiving unit should accordingly be reversed.

As an alternative to regenerating the CRC check bits using the generating polynomial and comparing the resultant CRC check bits with the received CRC check bits, it is known to determine the syndrome of the received check bits, where a non-zero syndrome indicates one or more errors in the received message.

As described above, in certain operating situations, the lead unit 12 may not be able to communicate directly with one or more of the remote units 12 and 13, or vice versa. In this situation a repeater station 26 serves to receive and retransmit the message between the transmitting and the sending units. According to one embodiment of the communication system 10, the repeater station 26 sets a predetermined bit in the received code word to designate the message as a repeated message, then transmits the message.

Thus the message received at the repeater is different than the message transmitted from the repeater. As a result, the repeater station 26 recalculates the vertical parity word and transmits the message with the set repeat bit and the recalculated vertical parity word. At the receiving unit (either the lead unit 14 or the remote units 12 and 13) the received vertical parity word is checked first. If correct, the receiving unit then resets the repeat bit prior to processing through the CRC code generator 68. This technique ensures that the use of the repeater station 26 does not thwart the function of the CRC bits.

In certain other operational situations the message is repeated by the remote unit 12 or 13, and a different bit in the message is set. The receiving unit handles these repeated messages in the same manner as if the message was repeated by the repeater station 26 as described above.

The use of the buffers 52 and 64 may not be required for all embodiments of the invention as certain parity generating and checking schemes can be executed "on the fly," that is, as the data bits are being processed, without the need to store the bits.

Figure 7:
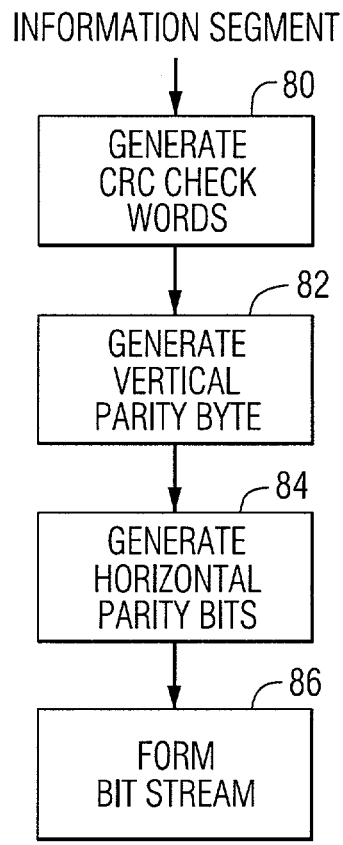
FIGS. 7 and 8 are flowcharts of the encoding and decoding processes according to the teachings of the present invention.

FIG. 7 is a flowchart of the error detecting code generating process executed at the transmitting unit, that is, either the lead unit 14, one or more of the remote units 12 and 13 or a repeater unit. After the information bits of the message are generated by the appropriate controller 30 or 32, at a step 80 the CRC check bits are generated. The vertical parity bits are generated at a step 82 based on both the information bits and the CRC check bits. At a step 84, one horizontal parity bit is generated for each byte, including the information bytes, the CRC check bytes and the vertical parity bytes. A bit stream is formed from the individual bytes and modulates a carrier signal for transmission over the communication channel 10, as represented by a step 86. As described above, the order in which the horizontal and vertical parities are checked and the correct parity bit assigned can be reversed according to another embodiment of the invention.

Figure 8:
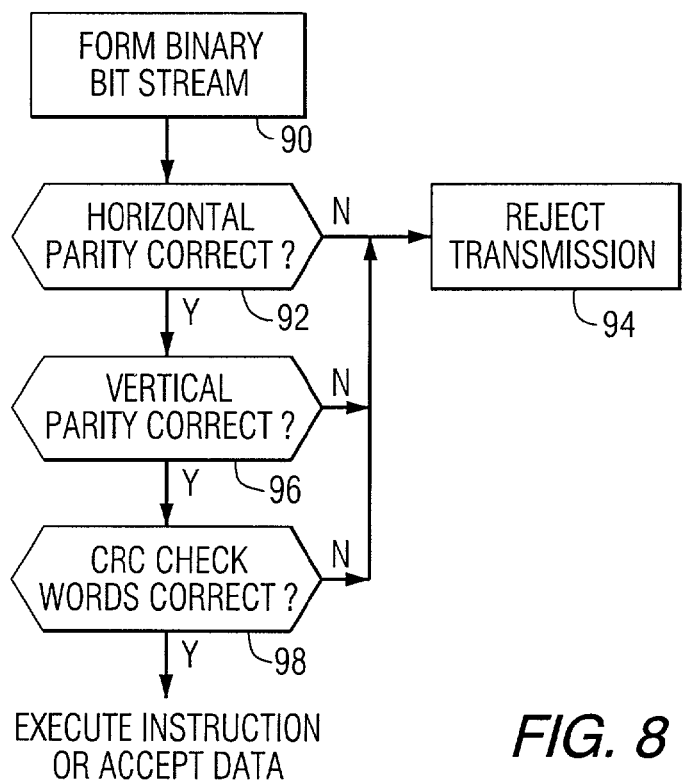

FIG. 8 is a flowchart of the error detection code analysis process carried out at the receiving unit. The message is demodulated and the binary bit stream formed from the demodulated signal at a step 90. Either concurrently with or after the bit stream is segregated into individual bytes, the horizontal parity is analyzed at a decision step 92. If the horizontal parity of one or more of the bytes is incorrect, the transmission is rejected as indicated at a step 94. If the horizontal parity is correct, processing continues to a decision step 96 where the vertical parity bits are checked. If the vertical parity is incorrect processing continues to the step 94. If the vertical parity is correct, then the CRC check bits are generated at a decision step 98 and compared with the received CRC check words. If the decision step 98 yields an affirmative answer, the received message is deemed correct and provided to the controller 30 or 32 for execution. As described above, in another embodiment, the order of the horizontal and vertical parity checking can be switched.

Although the invention has been described in conjunction with a communication channel between a lead locomotive and one or more remote locomotives in a distributed power train, the teachings can be applied to other communication channels. In particular in another railroad application the error coding techniques of the present invention can be applied to communication between a locomotive and wayside equipment, a locomotive monitoring and diagnostic center and equipment operated by personnel working in or around the rail yard.

What is claimed is:

1. A distributed power railroad communication system for communicating messages between lead and remote locomotives in a train and a repeater station for distributed power operations of the locomotives in the train, the communication system comprising:
   - a message source within one of the locomotives for providing a message; and
   - a processing device for forming information words of the message in response to the information provided by the source, for forming one or more error detection words having contents based on all of the information words in the message, and for forming geometric parity bits in response to the information words and the one or more error detection words;
   - wherein a message comprises the information words, the error detection words and the geometric parity bits, and wherein the information words further comprise a repeat bit position;
   - at the lead locomotive, a transmitter for transmitting the message to the repeater station;
   - at the repeater station, a transceiver for receiving the message and for forming a repeater message in response thereto, wherein the repeater message comprises a predetermined bit in the repeat bit position and repeater geometric parity bits, wherein the transceiver transmits the repeater message to the remote locomotives;
   - at the remote locomotives, a receiver for receiving the repeater message, and in response to a set repeat bit, resetting a repeat bit prior to generating one or more error detection words in response to the information words, for determining whether an error has occurred in the message.

* * * * *